United States Patent [19]

Epstein et al.

[11] Patent Number: 5,135,696
[45] Date of Patent: Aug. 4, 1992

[54] PROCESS FOR FORMING FIBERS OF SULFONATED POLYANILINE COMPOSITIONS AND USES THEREOF

[75] Inventors: Arthur J. Epstein, Bexley; Jiang Yue, Columbus, both of Ohio

[73] Assignee: Ohio State University Research Foundation, Columbus, Ohio

[21] Appl. No.: 529,024

[22] Filed: May 25, 1990

Related U.S. Application Data

[63] Continuation-in-part of Ser. No. 423,902, Oct. 19, 1989, which is a continuation-in-part of Ser. No. 193,964, May 13, 1988, Pat. No. 5,079,334.

[51] Int. Cl.$^5$ ............................................. D01F 6/96
[52] U.S. Cl. .............................. 264/184; 264/211.16; 264/210.8; 264/210.6
[58] Field of Search .................. 264/184, 210.8, 210.6, 264/211.16

[56] References Cited

U.S. PATENT DOCUMENTS

| | | | |
|---|---|---|---|
| 3,941,810 | 5/1976 | Koebner | 260/329 S |
| 4,488,943 | 12/1984 | Skotheim | 204/58.5 |
| 4,556,623 | 12/1985 | Tamura et al. | 430/83 |
| 4,585,581 | 4/1986 | Skotheim | 252/518 |
| 4,586,792 | 5/1986 | Yang et al. | 350/357 |
| 4,604,427 | 8/1986 | Roberts et al. | 525/185 |
| 4,615,829 | 10/1986 | Tamura et al. | 252/500 |
| 4,636,430 | 1/1987 | Moehwald | 428/304.4 |
| 4,742,867 | 5/1988 | Walsh | 165/96 |
| 4,749,260 | 6/1988 | Yang et al. | 350/357 |
| 4,822,638 | 4/1989 | Yaniger | 427/79 |
| 4,851,487 | 7/1989 | Yaniger et al. | 525/540 |
| 4,855,361 | 8/1989 | Yaniger | 525/436 |
| 4,935,164 | 6/1990 | Wessling et al. | 252/500 |
| 4,973,391 | 11/1990 | Madou et al. | 204/78 |

FOREIGN PATENT DOCUMENTS 61-197633 9/1986 Japan .

OTHER PUBLICATIONS

Paul, et al., J. Phys. Chem. 89:1441–1447 (1985).
Stafstrom et al., Phys. Rev. Lett. 59:1464 (1987).
Rice et al., Phys. Rev. Lett., 49:1455 (1982).
Bredas et al., Phys. Rev., B29:6761 (1984).
Chiang et al., Synth. Met. 13:193 (1986).
Ginder et al., Solid State Commun., 63:97 (1987).
Epstein et al., Synth. Met., 18:303 (1987).
Choi et al., Phys. Rev. Met., 59:2188 (1987).
Skotheim et al., Electrochem. Soc., 132:246 (1985).
Obayashi et al., Adv. Chem. Ser., 163:316 (1977).
Sammels et al., J. Electrochem. Soc., 131:617 (1984).
Chao et al., J. Am. Chem. Soc., 109:6627 (1987).
Hardy et al., J. Am. Chem. Soc., 1071:3823 (1985).
Gregory et al., Synthetic Metals, 28:C823–C835 (1989).
Nakajima et al., Synthetic Metals, 28:C629–C638 (1989).
Mizumoto et al., Synthetic Metals, 28:C639–C646 (1989).
Angelopoulos et al., J. Vac. Sci. Technol. B7 (6) Nov./Dec. 1989.
Lacroix et al., J. Electrochem. Soc., 136:1308–1313 (1989).
Computer Search Performed in the 1989 Am. Chem. Soc., (1989).
Chem. Abstracts, 106:33982g (1987).
WPI Data Base Search of JP Patent No. 61-197633.
Noshay et al., J. App. Polymer Sci., 20:1885–1903 (1976).

*Primary Examiner*—Hubert C. Lorin
*Attorney, Agent, or Firm*—Emch, Schaffer, Schaub & Porcello Co.

[57] ABSTRACT

Methods for producing fibers of self-protonated sulfonic acid-substituted polyaniline compositions. The sulfonated polyaniline compositions have faster electronic and optical responses to electrochemical potentials comparing to its parent polyaniline, improved environmental stability, and improved solubility than the parent polymer, polyaniline.

8 Claims, 2 Drawing Sheets

Structure a
Compound I

Structure b

Structure c
Compound II

Structure d

Structure a
Compound I

Structure b

Structure c
Compound II

Structure d

PROCESS FOR FORMING FIBERS OF SULFONATED POLYANILINE COMPOSITIONS AND USES THEREOF

BACKGROUND OF THE INVENTION

The present invention is a continuation-in-part of co-pending application Ser. No. 07/423,902 filed Oct. 19, 1989 which is a continuation-in-part of co-pending application Ser. No. 193,964 filed May 13, 1988, now U.S. Pat. No. 45,079,334 which applications are expressly incorporated herein by reference.

The present invention relates to processes for forming fibers of self-protonated sulfonic acid-substituted polyaniline compositions and their derivatives and uses thereof.

Polyaniline is a family of polymers that has been under intensive study recently because the electronic and optical properties of the polymers can be modified through variations of either the number of protons, the number of electrons, or both. The polyaniline polymer can occur in several general forms including the so-called reduced form (leucoemeraldine base), possessing the general formula

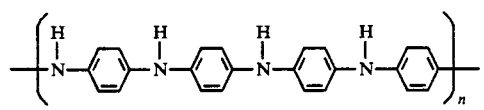

the partially oxidized so-called emeraldine base form, of the general formula

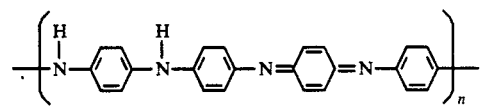

and the fully oxidized so-called pernigraniline form, of the general formula

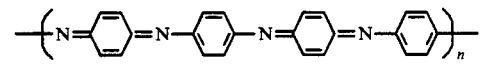

In practice, polyaniline generally exists as a mixture of the several forms with a general formula (I) of

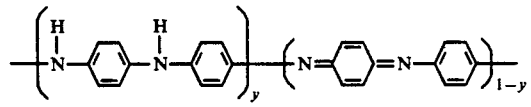

When $0 \leq y \leq 1$, the polyaniline polymers are referred to as poly(paraphenyleneamineimines) in which the oxidation state of the polymer continuously increases with decreasing value of y. The fully reduced poly(paraphenyleneamine) is referred to as leucoemeraldine, having the repeating units indicated above corresponding to a value of $y=1$. The fully oxidized poly(paraphenyleneimine) is referred to as pernigraniline, of repeat unit shown above corresponds to a value $y=0$. The partly oxidized poly(paraphenyleneimine) with y in the range of greater than or equal to 0.35 and less than or equal to 0.65 is termed emeraldine, though the name emeraldine is often focused on y equal to or approximately 0.5 composition. Thus, the terms "leucoemeraldine", "emeraldine" and "pernigraniline" refer to different oxidation states of polyaniline. Each oxidation state can exist in the form of its base or in its protonated form (salt) by treatment of the base with an acid.

The use of the terms "protonated" and "partially protonated" herein includes, but is not limited to, the addition of hydrogen ions to the polymer by, for example, a protonic acid, such as mineral and/or organic acids. The use of the terms "protonated" and "partially protonated" herein also includes pseudoprotonation, wherein there is introduced into the polymer a cation such as, but not limited to, a metal ion, $M^+$. For example, "50%" protonation of emeraldine leads formally to a composition of the formula

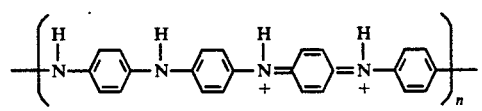

which may be rewritten as

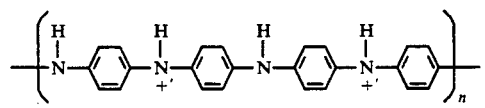

Formally, the degree of protonation may vary from a ratio of $[H^+]/[-N=]=0$ to a ratio of $[H^+]/[-N=]=1$. Protonation or partial protonation at the amine ($-NH-$) sites may also occur.

The electrical and optical properties of the polyaniline polymers vary with the different oxidation states and the different forms. For example, the leucoemeraldine base, emeraldine base and pernigraniline base forms of the polymer are electrically insulating while the emeraldine salt (protonated) form of the polymer is conductive. Protonation of emeraldine base by aqueous HCl (1M HCl) to produce the corresponding salt brings about an increase in electrical conductivity of approximately $10^{12}$; deprotonation occurs reversibly in aqueous base or upon exposure to vapor of, for example, ammonia. The emeraldine salt form can also be achieved by electrochemical oxidation of the leucoemeraldine base polymer or electrochemical reduction of the pernigraniline base polymer in the presence of an electrolyte of the appropriate pH. The rate of the electrochemical reversibility is very rapid; solid polyaniline can be switched between conducting, protonated and nonconducting states at a rate of approximately $10^5$ Hz for electrolytes in solution and even faster with solid electrolytes. (E. Paul, et al., *J. Phys. Chem.* 1985, 89, 1441–1447). The rate of electrochemical reversibility is also controlled by the thickness of the film, thin films exhibiting a faster rate than thick films. Polyaniline can then be switched from insulating to conducting form as a function of protonation level (controlled by ion insertion) and oxidation state (controlled by electrochemical potential). Thus, in contrast to, for example, the polypyrrole, polyaniline can be turned "on" by either a negative or a positive shift of the electrochemical potential, because polyaniline films are essentially insulating at sufficiently negative (approximately 0.00 V vs. SCE) or positive (+0.7 V vs. SCE) electrochemical potentials. Polyaniline can also then turned "off" by an opposite shift of the electrochemical potential.

The conductivity of polyaniline is known to span 12 orders of magnitude and to be sensitive to pH and other chemical parameters. It is well-known that the resistance of films of both the emeraldine base and 50% protonated emeraldine hydrochloride polymer decrease by a factor of approximately 3 to 4 when exposed to water vapor. The resistance increases only very slowly on removing the water vapor under dynamic vacuum. The polyaniline polymer exhibits conductivities of approximately 1 to 20 Siemens per centimeter (S/cm) when approximately half of its nitrogen atoms are protonated. Electrically conductive polyaniline salts, such as fully protonated emeraldine salt $[(-C_6H_4-NH-C_6H_4-NH^+)-Cl^-]_x$, have high conductivity ($10^{-4}$ to $10^{+2}$ S/cm) and high dielectric constants (20 to 200) and have a dielectric loss tangent of from below $10^{-3}$ to approximately $10^1$. Dielectric loss values are obtained in the prior art by, for example, carbon filled polymers, but these losses are not as large nor as readily controlled as those observed for polyaniline.

The present invention is a continuation-in-part of and related to the invention disclosed in the co-pending application Ser. No. 07/423,902 filed Oct. 19, 1989 which is expressly incorporated herein by reference. That application discloses sulfonated polyaniline compositions and their derivatives, processes for their preparation and uses thereof.

While the preparation of polyaniline polymers and the protonated derivatives thereof is known in the art, it is novel to prepare sulfonated polyaniline compositions which are capable of being "self-protonated" or "self-doped". The use of the terms "self-protonated" and "self-doped" herein includes, but is not limited to, the reorganization of hydrogen ions on the polymer i.e., the absence of any counterion not covalently bonded to the polymer chain. For example, self-doping or self-protonation of a polyaniline base polymer leads to a polyaniline salt polymer and a reorganization of the electronic structure which then forms a polaronic metal. The conductivity of such polaronic metal is independent of external protonation.

It is known that most polymers consist of bonded carbon-to-carbon or carbon-nitrogen repeat units along the polymer backbone chain. While these kinds of chemical bonds are among the strongest bonds in nature, such strength is not often realized in most polymers since the polymer molecules exist primarily as entangled random coils.

It is further known that crystallization of polymers improves the strength and modulus of the polymers and improves the conductivity as well, by reducing the degree of molecular randomization and by increasing the coherence length of the polymer chain. While it is known that the drawing of polymers into continuous strands or fibers is one method of improving the crystallinity of the polymers, fiberization methods have, until now, not been feasible for producing fibers of sulfonated polyaniline polymers.

SUMMARY OF THE INVENTION

The present invention provides methods for producing fibers of a polymeric acid polymer which is capable of protonating or doping itself to form an electrically conducting polymer. The sulfonated polyaniline polymer has faster electronic, electrochemical, chemical, and optical responses and improved solubility than the parent polymer, polyaniline. The solubility of the sulfonated polyaniline polymer is increased greatly due to the presence of the sulfonic group $SO_3H$. The sulfonated polyaniline polymer is easy to dissolve in basic aqueous solutions in which the polyaniline polymer is insoluble. In addition, due to the electron withdrawing effects of the $SO_3H$ group, the sulfonated polyaniline polymer has improved environmental stability over the polyaniline polymer. The process for producing the sulfonated polyaniline comprises reacting the polyaniline polymer with fuming concentrated sulfuric acid or $SO_3$ vapors.

The present invention also relates to the use of sulfonated polyaniline compositions and their derivatives in electronic, electrochemical, chemical, and optical applications.

According to the present invention, fibers of sulfonated polyaniline are formed by dissolving a sulfonated polyaniline composition either an acidic solution or a basic solution. A stream of the solution of dissolved sulfonated polyaniline is then drawn through a suitable dispersion medium whereby the sulfonated polyaniline composition coagulates in the dispersing medium. In one embodiment the dissolving solution comprises concentrated sulfuric acid and the coagulating medium comprises methyl alcohol. In another embodiment, the dissolving solution comprises sodium hydroxide and the coagulating medium comprises hydrochloric acid.

DETAILED DESCRIPTION OF THE INVENTION

Figure 1A:
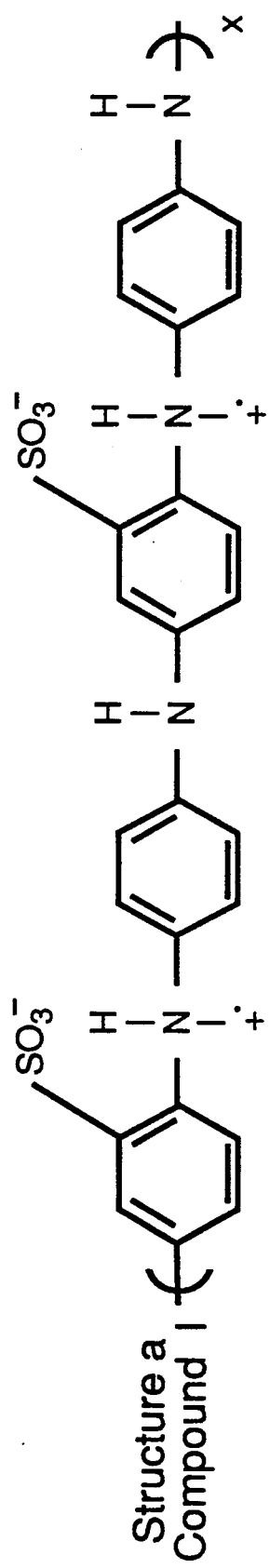
FIG. 1 is a schematic illustration of the different structures of sulfonated polyaniline, (a and b), the ammonia salt (c) and the emeraldine base (d).

The present invention relates to processes for forming fibers of sulfonic acid substituted polyaniline compositions and their derivatives and uses thereof.

The self-protonated sulfonated polyaniline compositions have the formula I

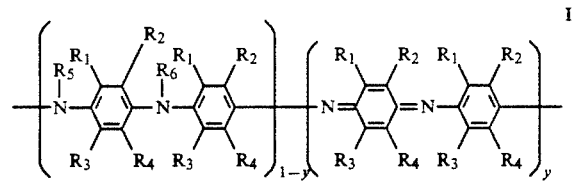

wherein $0 \leq y \leq 1$; $R_1$, $R_2$, $R_3$, $R_4$, $R_5$ and $R_6$ are independently selected from the group consisting of H, $-SO_3^-$, $-SO_3H$, $-R_7SO_3^-$, $-R_7SO_3H$, $-OCH_3$, $-CH_3$, $-C_2H_5$, $-F$, $-Cl$, $-Br$, $-I$, $-NR_{7\,2}$, $-NHCOR_7$, $-OH$, $-O^-$, $-SR_7$, $-OR_7$, $-OCOR_7$, $-NO_2$, $-COOH$, $-COOR_7$, $-COR_7$, $-CHO$ and $-CN$, wherein $R_7$ is a $C_1$-$C_8$ alkyl, aryl or aralkyl group. For the sake of clarity, the structure shown in formula I is in the non self-protonated form.

The fraction of rings containing at least one $R_1$, $R_2$, $R_3$ or $R_4$ groups being an $-SO_3^-$, $-SO_3H$, $-R_7SO_3^-$ or $-R_7SO_3H$ can be varied from a few percent to one hundred percent. In certain embodiments the percentage ranges from at least approximately 20% up to and including 100%. It is within the contemplated scope of the present invention that the $-R_7SO_3^-$ and $-R_7SO_3H$ substituents can be varied so that the sulfonated polyaniline is soluble in a range of solvents in order to make the sulfonated polyaniline polymer more easily blendable with other polymers and/or more easily cast onto a variety of surfaces.

The solubility of sulfonated polyaniline can be varied by changing the degree of sulfonation (i.e., the sulfonation time and/or temperature in $H_2SO_4(SO_3)$ or $SO_3$ or other sulfonation agents). It is noted that the oxidation state of the polymer (from leucoemeraldine through emeraldine to pernigraniline) and the degree of sulfonation (x) can be independently varied. Here x is the fraction of $C_6$ rings which have an $SO_3^-$ or $SO_3H$ group attached.

When $x=0$, the polymer does not dissolve in either basic or acidic aqueous solutions. Upon increasing the value of x, the polymer becomes soluble in strongly basic, basic, weakly basic and eventually in acidic aqueous solutions. This progressive improvement in solubility implies that the polymer becomes soluble in neutral media, particularly $H_2O$, at the appropriate value of x, yielding a water-soluble conducting polymer. The color of soluble sulfonated polyaniline in acidic solution is green, indicating it is the conducting salt form.

The solubility of polyaniline is increased greatly in basic aqueous solution by the presence of $-SO_3H$ group on the phenyl rings. This is in contrast with polyaniline which when washed with basic solutions, converts to the insoluble base form.

Protonation of the emeraldine base polymer leads to the emeraldine salt polymer and a reorganization of the electronic structure to form a polaronic metal. Since benzenesulfonic acid is a strong acid, about as strong as hydrochloric acid, the sulfonated polyaniline is capable of self-doping. Hence, the conductivity of the sulfonated polyaniline is independent of external protonation.

Being able to dope itself, the sulfonated polyaniline polymer has enhanced optical and electrical response to electrochemical potential as compared with the parent polyaniline polymer. Since the solid-state diffusion of counterions in and out of a polymer during electrochemical processes is often the rate controlling step in the kinetics, it also limits the speed of both optical and electrical response of polymers. In the self-doped conjugated polymer of the present invention, the counterions are not necessary from the medium. The positive charge introduced into the conjugated pi electron system of the backbone of the polymer is compensated by the protons migrating out of the polymer, or vice versa, leaving behind the opposite charged counterion. Being the smallest and most mobile ion, proton hopping mechanisms lead to relatively fast doping kinetics as compared to those counterions migrating in or out of the polymer. As a consequence, it is possible to achieve sufficient speed to be useful for a variety of technological applications.

The sulfonated polyaniline polymers provide opportunities to use the phenomena of the dependence of electrical and optical properties on the backbone chain conformation and on the substituent as well as chain properties which change the chemical properties of polyaniline in a number of useful applications. The side groups on polyaniline also can affect the charge transport in polyaniline.

The chemical synthesis of the sulfonated polyaniline polymers of the present invention is accomplished by reacting polyaniline with concentrated or fuming sulfuric acid, gaseous $SO_3$, or other sulfonation agents. Examples of several of the methods for such synthesis are disclosed below.

Materials—Aniline and other chemicals were obtained from Aldrich and were all reagent grade or better. Hydrochloric acid and ammonium hydroxide were used as received. Different pH buffer solutions were commercially purchased.

Chemical Synthesis I: Emeraldine hydrochloride powder was synthesized from aniline and $(NH_4)S_2O_8$ then converted to analytically pure emeraldine base polyaniline using the method described previously in A. G. MacDiarmid, J. C. Chiang, A. F. Richter, N. L. D. Somasiri and A. J. Epstein in L. Alcacer (ed.) *Conducting Polymers*, D. Reidel Publishing Co., Dordrecht, The Netherlands (1987).

For the sulfonation of polyaniline, 1.5 g polyaniline (dry emeraldine base form) was dissolved into 40 ml fuming sulfuric acid $H_2SO_4(SO_3)$ with constant stirring at room temperature. During the sulfonation period the color of the solution changed from dark purple to dark blue. After approximately 2 hours, the solution was slowly added during about 20 minutes to 200 ml methanol while maintaining the temperature between about 10°–20° C. by an ice bath. A green powder precipitate was formed during the mixing. After the mixing, 100 ml of less polar acetone was added to the solution in order to increase the precipitate. The green powder was then collected on a Buchner funnel using a water aspirator. The precipitate cake was washed portionwise (50 ml/portion) with methanol until the portion of the filtrate showed pH=7 when tested by wet pH paper. The liquid level in the Buchner funnel was constantly adjusted so that it remained above the top of the precipitate. This prevented cracking of the precipitate cake, which would result in inefficient washing of the precipitate cake.

Figure 1B:
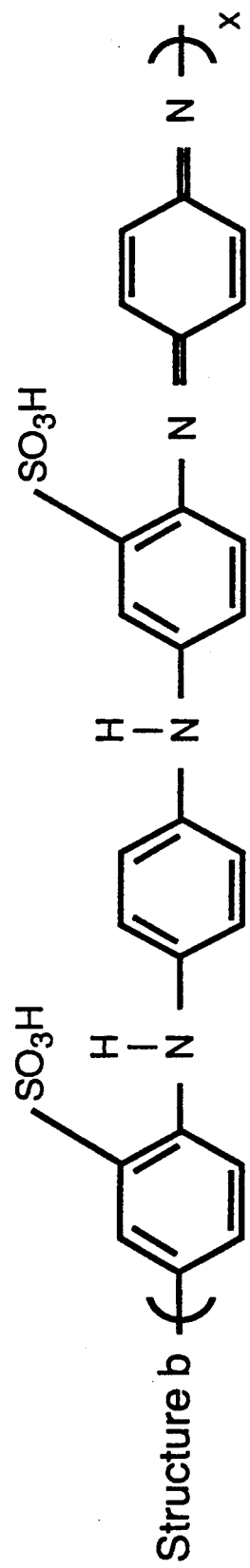
Figure 1C:
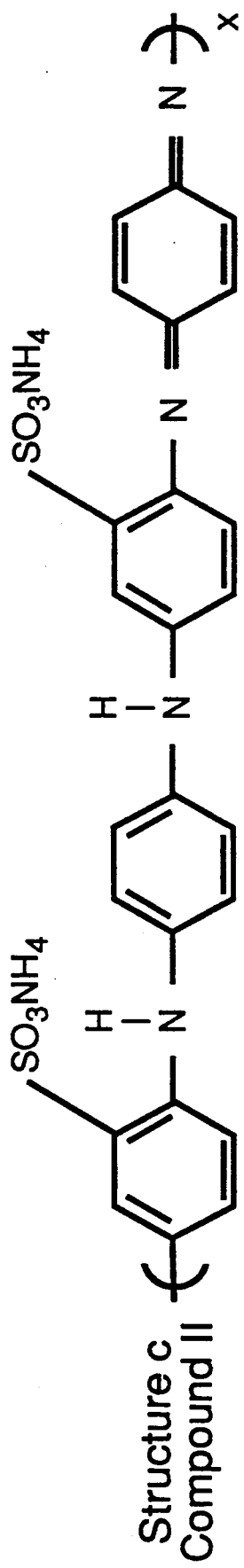
Figure 1D:
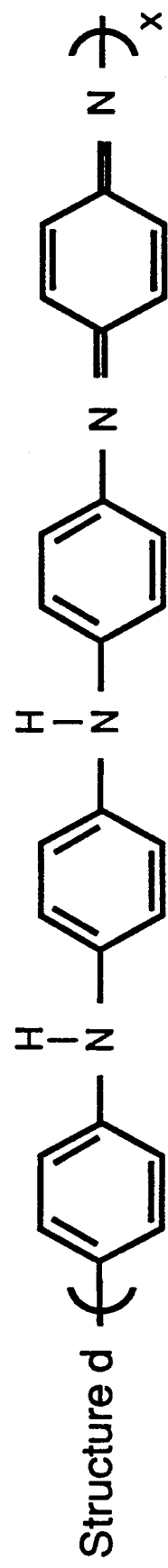

After the above washing, the precipitate remained under suction for approximately 10 minutes. It was then transferred on the filter paper to a vacuum desicator and dried under dynamic vacuum for 24 hours. Elemental analyses, as shown in Table I are consistent with the composition shown in FIG. 1 as structure a, compound I, which is sulfonated, protonated polyaniline in the emeraldine oxidative state. The self-doped polyaniline is readily dissolved in a dilute aqueous base solution to form a homogeneous blue-violet solution. The solubility of compound I in 0.1M $NH_4OH$ and NaOH is about 23 mg/ml.

TABLE 1

| | Elemental Analyses[a] of Chemically Synthesized Sulfonic Ring-Substituted Polyaniline | | | | | | |
|---|---|---|---|---|---|---|---|
| sample | C | H | N | S | O[b] | Total | Formula |
| PAN[c] (cal.) | 79.54 | 5.00 | 15.46 | — | — | 100 | $C_{17}H_9N$ |
| PAN (found) | 79.14 | 4.96 | 15.16 | — | — | 99.26 | |
| SPAN (cal.) | 51.67 | 3.96 | 10.04 | 11.49 | 22.84 | 100.00 | $C_{12}H_9N_2SO_3(H_2O)_{0.98}$ |

TABLE 1-continued

| | Elemental Analyses[a] of Chemically Synthesized Sulfonic Ring-Substituted Polyaniline | | | | | | |
|---|---|---|---|---|---|---|---|
| sample | C | H | N | S | O[b] | Total | Formula |
| SPAN (found) | 52.12 | 3.98 | 10.13 | 11.18 | 22.59 | 100.00 | |

[a]C, H, and N analyses were performed by Dr. R. Kohli at U. of Pennsylvania, S analysis was carried out by M-H-W Laboratories, Phoenix, AZ.
[b]Oxygen content is by difference.
[c]PAN refers to polyaniline and SPAN to ring-sulfonated polyaniline.

Chemical Synthesis II: 1.5 g polyaniline (dry emeraldine base form) was dissolved into 40 ml concentrated sulfuric acid $H_2SO_4$, and the temperature slowly raised from the room temperature to 70° C., in water bath in 3 hour period with the constant stirring. The temperature was kept at 70° C. for 15 hours. Then the temperature was raised to 95° C. within 0.5 hour and kept there for 4 hours. The reaction mixture was cooled down to room temperature. The product was very slowly added to −38° C. ice made from 160 ml distilled $H_2O$ in order to precipitate the polymer. The temperature of the solution was not allowed to reach higher than 0° C. during the process. After the temperature of the solution reached room temperature the solution was filtered to obtain a fine powder of sulfonated polyaniline. Large particles were obtained by subsequently heating the room temperature solution up to 70° C. in a two hour period, then cooling to room temperature, and conducting filtration to separate the sulfonated polyaniline from the solution. The sulfonated polyaniline was washed with an excess of $H_2O$ until the filtrate was neutral (as tested by pH paper). Dry sulfonated polyaniline was obtained by pumping under dynamic vacuum at room temperature for 48 hours.

Chemical Synthesis III: From the Chemical Synthesis II described above a copolymer (i.e., the polymer mixture of polyanilines and sulfonated polyaniline) was obtained by partially sulfonating polyaniline. This was done in exactly the same way described in the Chemical Synthesis II except utilizing shorter sulfonation times and/or lower sulfonation temperature.

Chemical Synthesis IV: Another way to prepare the copolymer polyaniline-sulfonated polyaniline was to react 2-aminobenzene-sulfonic acid (2ASA) with oxidizing agent in the presence of aniline. 10 g (0.58 mol) 2ASA and 2 ml (0.02 mol) aniline were dissolved in 500 ml 1M HCl. A prepared solution of 6.609 g (0.029 mol) $(NH_4)_2S_2O_8$ in 200 ml 1M HCl was added dropwise to the monomer solution with vigorous stirring during a period of 10 minutes. After 1.5 hours, the precipitate was collected on a Buchner funnel. The precipitate was washed with 1M HCl until the filtrate was colorless. Then the precipitate was washed by 500 ml $H_2O$. To ensure that the copolymer was in its neutral form, the precipitate was then transferred into a beaker containing 500 ml of $H_2O$ and stirred at room temperature for 4 hours. The mixture was filtered until the pH of the filtrate was 7. The dry copolymer was obtained by pumping under dynamic vacuum at room temperature for 48 hours.

Chemical Synthesis V: Another method for producing sulfonated polyaniline comprises exposing the polyaniline polymer to $SO_3$ gas, which method is fully discussed in co-pending application Ser. No. 07/529,024, filed May 25, 1990, entitled Processes For The Preparation Of Sulfonated Polyaniline Compositions and Uses Thereof, which is expressly incorporated herein by reference. Conductivities of the compound I was measured on compressed pellets of the powder by using four point probe techniques with a Keithley 220 constant current source and Keithley 181 voltmeter.

Conductivity studies are consistent with the sulfonation of emeraldine base with fuming sulfuric acid proceeding to give a self-doped, sulfonated, protonated forms of the emeraldine oxidative state of polyaniline, the compound I which has a conductivity of about 0.1 S/cm. This polymer can be regarded as being formed by the hypothetically initial formation of the strong acid, shown as structure b in FIG. 1, which then immediately protonates the imine nitrogen atoms to give the conducting polymr in an entirely analogous manner to strong acids such as HCl. Treatment of the structure b compound with an aqueous (ammonium) base yields the sulfonated, non-protonated insulating ammonium salt forms analogous to emeraldine base, viz, the structure c compound shown in FIG. 1.

The conductivity of the compound I ($\sigma \sim 0.1$ S/cm) is similar to that of emeraldine hydrochloride measured under the same experimental conditions ($\sigma \sim 1-5$ S/cm; laboratory air), but lower than that $\sigma \sim 18$ S/cm of high molecular weight emeraldine hydrochloride. The self-doped sulfonated polyaniline with emeraldine oxidative state differs dramatically from nonexternally doped polyaniline in conductivity. Since sulfonic acid is a strong acid, approximately as strong as hydrochloric acid, the compound I is capable of doping itself. Pressed pellets of the dark green self-doped compound I had a room temperature conductivity of about 0.1 S/cm in contrast to the purple color and insulating behavior of polyaniline emeraldine base form. However, the conductivity of compound I is lower than that of emeraldine hydrochloride pressed pellets; analogy with earlier study of poly(o-toluidine), the lower conductivity is in accord with increased conduction electron localization induced by the side chain effects of $-SO_3^-$.

The solubility of the compound I also differs markedly from that of the corresponding polyaniline polymer. The compound I dissolves completely in aqueous 0.1M $NH_4OH$ or $NaOH$ to give a blue-violet solution while polyaniline washed with such solvent converts to the insoluble base form. The compound I partially dissolves in NMP to form a blue color solution and as well as DMSO (dimethyl sulfoxide) to show green color.

The deprotonation results in a 5 to 10 order of magnitude decrease in conductivity. Compound I differs from emeraldine hydrochloride in that it is soluble in aqueous 0.1M $NH_4OH$ and $NaOH$.

Elemental analyses and FTIR data suggest that, depending on the sulfonation times and temperatures, the number of $-SO_3H$ groups per phenyl ring varied from 0.2 to 1.0. The conductivity is independent of pH in the range of pH values smaller than or equal to 7.

The sulfonated polyaniline compositions and their derivatives are useful in electronic, electrochemical, chemical, and optical applications. The sulfonated polyaniline compositions have a more rapid electrochemical response than polyaniline. The ability of the sulfonated polyaniline compositions to have a fast switching speed between a conducting and a nonconducting state with good reversibility makes such compositions attractive polymers to use for a variety of electrochemical applications.

The sulfonated polyaniline compositions and derivatives thereof have, or can be designed to have, desired processability in terms of, for example, viscosity, flexural strengths, solubility, adhesion to substrates, cross-linking, melting point, weight, adaptability to filler loading and the like. This is achieved by varying as desired the degree of self-protonation, the state of oxidation, and the type and degree of substituents on the polymer. Certain substituents may be preferred for the facilitation of desired processing parameters, such as increasing or decreasing solubility, altering extrusion parameters (rheology), achieving a specific viscosity, and the like.

The present invention provides a process for drawing sulfonated polyaniline compositions into fibers. The sulfonated polyaniline composition is dissolved in a suitable solution at a desired temperature until the solution is homogeneous. At least one stream of the homogeneous sulfonated polyaniline polymer solution is attenuated or drawn into a continuous filament. The continuous filament is drawn through a dispersing or coagulating medium. It is contemplated that the continuous filament can be drawn by ejecting a vertical stream of the polymer solution into a reservoir of the coagulating medium. The fibers or filaments can then be collected in a conventional manner known to those skilled in the art. The coagulating medium thus contacts the stream of continuous filament as it is being formed or drawn, causing the sulfonated polyaniline composition to coagulate or precipitate out of the homogenous solution.

It is contemplated that the various methods available for producing a continuous filament having a relatively constant diameter can be employed with the fiber forming method of the present invention. For example, the coagulating medium can be applied to the continuous filament in other such manners as, for example, being spray applied to the filament as it is being drawn.

According to the present invention, useful dissolving solutions include any suitable solvent for the sulfonated polyaniline compositions. The solubility of the various sulfonated polyaniline compositions is dependent upon the degree of sulfonation of the composition itself. The degree of sulfonation can generally be defined by referring again to formula I above, wherein the fraction of rings containing at least one $R_1$, $R_2$, $R_3$ or $R_4$ groups, wherein at least one of $R_1$, $R_2$, $R_3$ or $R_4$ is $-SO_3^-$, $-SO_3H$, $-R_7SO_3^-$, or $-R_7SO_3H$, varies from a few percent up to and including one hundred percent. Thus, examples of suitable dissolving solutions can comprise either acidic or basic solutions, such as concentrated $H_2SO_4$ or NaOH.

Further, according to the present invention, useful coagulating media include various compositions in which the sulfonated polyaniline composition is essentially insoluble. The insolubility or degree of solubility of the sulfonated polyaniline composition is dependent largely upon the degree of sulfonation and the type of $R_1$, $R_2$, $R_3$, $R_4$, $R_5$ and $R_6$ substituents as generally defined above, attached to the polyaniline polymer. Thus, examples of suitable coagulating media can include, for example, water, methyl alcohol, ethyl alcohol, isopropyl alcohol, acidic aqueous solutions such as HCl, inorganic aqueous solutions such as LiCl, NaCl and the like, and various mixtures or combinations of any or all such coagulating media.

For the purposes of illustration only, various examples are given below. It should be understood that these examples are not limiting and that other methods of drawing or forming fibers of sulfonated polyaniline compositions can also be utilized in the method of the present invention.

EXAMPLE

One method of drawing a fiber of a sulfonated polyaniline composition comprises dissolving a predetermined quantity of a sulfonated polyaniline polymer composition into concentrated sulfuric acid to about 10–15 wt. percent, and stirring at about room temperature until the solution was homogeneous. The polymer solution was transferred to a syringe with a needle having a 0.1 mm diameter. A stream of the polymer solution was steadily ejected into a 30 cm long, 1.5 cm wide vertical reservoir containing ethyl alcohol as the coagulating medium. As the sulfonated polyaniline polymer falls due to the force of gravity, through the coagulating medium, a fiber is formed. With the temperature of the ethyl alcohol at about room temperature, a fiber of approximately 10 cm in length was formed. It should be understood that an increase in the viscosity of the polymer solution will aid in the fiber forming process.

EXAMPLE

Another especially suitable coagulating medium comprises methyl alcohol.

EXAMPLE

Another method for drawing a fiber comprises dissolving a predetermined quantity of a sulfonated polyaniline composition in about 2–10 wt. percent of NaOH, and drawing the fiber in the manner described above wherein the coagulating medium comprises an acidic solution such as HCl.

The conductivity of the fibers formed according to the present invention, ranges from about 0.1 to about 1 S/cm, this showing that the fibers formed are made of a sulfonated polyaniline composition.

Fibers produced according to the present invention can be used in any of the various application or contemplated uses disclosed in the parent co-pending application, Ser. No. 07/423,902 which application and uses disclosed therein are expressly incorporated herein by reference.

For example, it is contemplated that fibers of sulfonated polyaniline compositions or derivatives thereof, or fibers of sulfonated polyaniline copolymerized with another polymer can be drawn or extruded and subsequently woven into electromagnetic radiation absorbing fabric, garments, coverings, and the like. In this manner radar absorbing clothing can be produced.

Sulfonated polyaniline absorbs electromagnetic radiation in the visible spectrum, in the infrared range, and in the ultraviolet range. Thus, fibers produced according to the present invention can be used to absorb infrared, visible, or ultraviolet waves comprising exposing the sulfonated polyaniline to infrared, visible or ultraviolet waves, whereby the infrared, visible, or ultraviolet waves are absorbed by the sulfonated polyaniline.

In addition, fibers produced according to the present invention can be used to absorb microwave radiation comprising exposing sulfonated polyaniline to microwave radiation, whereby the microwave radiation is absorbed by the sulfonated polyaniline; and for electromagnetic shielding.

It is further contemplated that fibers of sulfonated polyaniline compositions or derivatives thereof can be used as a fiber reinforcement material and be entrained in a matrix resin material.

While the invention has been disclosed in this patent application by reference to the details of preferred embodiments and examples of the invention, it is to be understood that this disclosure is intended in an illustrative rather than in a limiting sense, as it is contemplated that modifications will readily occur to those skilled in the art, within the spirit of the invention and the scope of the claims which follow.

We claim:

1. A method of producing at least one continuous filament of a sulfonated polyaniline composition having a chemical composition of formula I

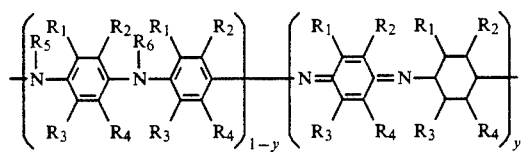

wherein $0 \leq y \leq 1$, $R_1$, $R_2$, $R_3$, $R_4$, $R_5$ and $R_6$ are independently selected from the group consisting of H, $SO_3^-$, $-SO_3H$, $-R_7SO_3^-$, $-R_7SO_3H$, $-OCH_3$, $-CH_3$, $-C_2H_5$, $-F$, $-Cl$, $-Br$, $-I$, $-NR_7{}_2$, $-NHCOR_7$, $-OH$, $-O^-$, $-SR_7$, $-OR_7$, $-OCOR_7$, $-NO_2$, $-COOH$, $-COOR_7$, $-COR_7$, $-CHO$ and $-CN$, wherein $R_7$ is a $C_1$-$C_8$ alkyl, aryl or aralkyl group, and wherein the fraction of rings containing at least one $R_1$, $R_2$, $R_3$ or $R_4$ group being an $-SO_3^-$, $-SO_3H$, $-R_7SO_3^-$, or $-R_7SO_3H$ varies from approximately 20 percent to one hundred percent comprising:

dissolving the sulfonated polyaniline polymer composition in an aqueous acid or basic solution to form a solution;

supplying at least one stream of the sulfonated polyaniline polymer solution;

contacting the stream of the sulfonated polyaniline polymer solution with a medium in which the sulfonated polyaniline polymer is substantially insoluble whereby the sulfonated polyaniline polymer precipitates out of the solution as filament, and, collecting the filament.

2. The method of claim 1, in which the stream of the sulfonated polyaniline polymer solution is in contact with the precipitating medium by drawing the stream through a quantity of the medium.

3. The method of claim 1, in which the stream of the sulfonated polyaniline polymer solution is contacted with a spray of the precipitating medium.

4. The method of claim 1, in which the temperature of the sulfonated polyaniline polymer solution is between $-38°$ C. and $100°$ C.

5. The method of claim 1, in which the viscosity of the sulfonated polyaniline polymer solution is increased by decreasing the temperature of the solution.

6. The method of claim 1, in which the solubility of the sulfonated polyaniline polymer composition in the solution depends upon the degree of sulfonation of the sulfonated polyaniline composition.

7. The method of claim 1, in which the solution comprises the sulfonated polyaniline polymer and $H_2SO_4$ and the precipitating medium comprises at least one of: water, methyl alcohol, ethyl alcohol, isopropyl alcohol, an acidic aqueous solution or an inorganic aqueous solution.

8. The method of claim 1, in which the solution comprises the sulfonated polyaniline composition and NaOH, and the precipitating medium comprises HCl.

* * * * *